(12) United States Patent
Lin

(10) Patent No.: US 7,288,989 B2
(45) Date of Patent: Oct. 30, 2007

(54) LOW-NOISE AMPLIFIER WITH A TRANSFORMER

(75) Inventor: Chih-I Lin, Unterhaching (DE)

(73) Assignee: Infineon Technologies AG, Munich (DE)

( * ) Notice: Subject to any disclaimer, the term of this patent is extended or adjusted under 35 U.S.C. 154(b) by 110 days.

(21) Appl. No.: 11/034,453

(22) Filed: Jan. 12, 2005

(65) Prior Publication Data

US 2005/0258899 A1 Nov. 24, 2005

(30) Foreign Application Priority Data

Jan. 12, 2004 (DE) ............ 10 2004 001 660

(51) Int. Cl.
*H03F 1/00* (2006.01)
(52) U.S. Cl. ................ 330/195; 330/165
(58) Field of Classification Search ............ 330/154, 330/165, 192, 195, 197
See application file for complete search history.

(56) References Cited

U.S. PATENT DOCUMENTS 5,339,048 A * 8/1994 Weber .................. 330/302

6,259,325 B1 * 7/2001 Ishizuka et al. .......... 330/307

OTHER PUBLICATIONS

Bakalski et al., "A Monolithic 2.45 GHz, 0.56 W Power Amplifier with 45% PAE at 2.4V in Standard 25 GHz $F_T$Si-Bipolar", IEEE Symp. on Circuits and Systems, 2002, vol. 4, pp. 803-806, (4 pages).

* cited by examiner

*Primary Examiner*—Khanh Van Nguyen
(74) *Attorney, Agent, or Firm*—Maginot, Moore & Beck

(57) ABSTRACT

An amplifier circuit includes a transistor having a control terminal, a first and a second terminal, a signal input terminal coupled to the control terminal of the transistor, as well as a transformer with a primary side and a secondary side, the primary side of which is coupled to the first or second terminal of the transistor. The amplifier circuit further includes a signal output terminal coupled to the secondary side of the transformer. Hereby it is possible to provide an amplifier circuit with a better characteristic as opposed to a conventional amplifier circuit, which is further easy to manufacture.

20 Claims, 5 Drawing Sheets

FIG 5

| PARAMETER | AIM | LNA WITH ON-CHIP TRANSFORMER 2.75V / 27°C | CONVENTIONAL LNA WITH ON-CHIP COIL 2.75V / 27°C |
|---|---|---|---|
| CURRENT CONSUMPTION (mA) | < 6.0 | 5.6 | 5.6 |
| AMPLIFICATION (dB) | 16.0 | 15.7 (HIGHER) | 14.3 |
| FLATNESS OF THE AMPLIFICATION (dB) | < 0.6 | 0.2 (BETTER) | 0.3 |
| MAX. AMPLIFICATION / @ FREQUENCY | 16.0/2.14 | 16.0 @2.05GHz (BETTER) | 17.3 @ 1.2GHz |
| INPUT ADAPTATION (dB) | < -10 | -10 | -20 |
| OUTPUT ADAPTATION (dB) | < -10 | -18 | -12 |
| REVERSE ISOLATION (dB) | < -20 | -26" (BETTER) | -20 |
| NOISE NUMBER (dB) | < 1.5 | 1.24 | 1.24 |
| IP1dB (dBm) | -15.0 | -14.4 (BETTER) | -15.6 |
| IIP3 (dBm) | 0.0 | 2.0 (BETTER) | -1 |
| MIN. STABILITY FACTOR (1MHz 10GHz) | > 1 | 1.26 (BETTER) | 1.06 |

LOW-NOISE AMPLIFIER WITH A TRANSFORMER

CROSS-REFERENCE TO RELATED APPLICATION

This application claims priority from German Patent Application No. 102004001660.7, which was filed on Jan. 12, 2004, and is incorporated herein by reference in its entirety.

BACKGROUND OF THE INVENTION

1. Field of the Invention:

The present invention relates to an amplifier circuit and, in particular, the present invention relates to an electronic amplifier circuit with a transistor and a transformer.

2. Description of the Related Art:

In modern mobile telecommunication, LNAs (low-noise amplifiers) are employed in the front end of a receiver. Such LNAs should generally meet several demands. First, they are supposed to have a low noise number and an amplification prescribed by the customer (mostly between 15 dB and 18 dB). Further demands would for example be low current consumption at a highest possible compression point P1dB and high third-order intermodulation IP3, so as to be able to achieve high sensitivity in the receiver. In order to provide a low noise number, for this purpose most of the time a single-stage emitter basic circuit of npn bipolar transistors (npn-BJTs) is employed. Such npn bipolar transistors in emitter basic circuit, however, often do not have sufficient amplification when taking all parameters into account in the design of a LNA.

In order to increase the amplification of such LNAs, often multi-stage amplifiers are used. But thereby the noise number is degraded by some tenths of dB, so that this partly takes on unacceptably high values. Furthermore, significantly higher current consumption than in LNAs with a single-stage emitter basic circuit of an npn bipolar transistor can be registered. Moreover, the third-order intermodulation IP3 and the compression point P1dB achievable by such multi-stage amplifiers are often influenced negatively when the amplification is increased. In order to compensate for these disadvantages, one possibility is to make the npn bipolar transistor (npn-BJT) smaller. This method, however, has similar problems as they occur in multi-stage amplifiers.

SUMMARY OF THE INVENTION

It is the object of the present invention to provide a low-noise amplifier having an improved characteristic and that is also easy to manufacture.

In accordance with a first aspect, the present invention provides an amplifier circuit, having a transistor having a control terminal, a first and a second terminal; a signal input terminal coupled to the control terminal of the transistor; a transformer with a primary and a secondary side, the primary side of which is coupled to the first or second terminal of the transistor; a signal output terminal coupled to the secondary side of the transformer.

The present invention is based on the finding that by connecting a transformer between the corresponding terminal of the transistor and the signal output terminal of the amplifier circuit a multiplicity of advantages are achievable by taking advantage of the primary-side and secondary-side properties of the transformer. According to the invention, in particular, a lossy on-chip transformer between the transistor and the signal output terminal is advantageously employable. Thus, according to the invention, an amplifier circuit with an improved characteristic may be provided.

Preferably, a primary-side impedance between a first and a second primary-side terminal is greater than a secondary-side impedance between a first and a second secondary-side terminal. Hereby, the transformer acts as an impedance transformer and increases the output impedance as seen from the transistor to a higher value than with direct coupling of the signal output terminal to the first or second terminal of the transistor. By this increase of the output impedance as seen from the transistor, the transistor may provide increased power to the signal output terminal. This has an advantageous effect in particular when the inventive amplifier circuit at the signal input terminal is imparted with a radio-frequency signal to be amplified by the amplifier circuit.

An advantage of the inventive approach thus consists in the possibility to increase the amplification (i.e. the amplification factor) of the amplifier circuit as opposed to a conventional amplifier circuit. Furthermore, a lower current between the first and the second terminal of the transistor may be realized at default amplification as opposed to a conventional amplifier circuit. Since, in particular in practical applications, a non-linear behavior of the transistor results in a distortion of the current between the first and the second terminal of the transistor, by the inventive approach also a higher compression point P1dB and a higher third-order intermodulation IP3 than in a conventional amplifier circuit may be realized.

Furthermore, it is to be noted that in a conventional narrow-band low-noise amplifier the frequency response of the amplification can often not be adjusted in a satisfactory manner in order to suppress crosstalk between individual frequency bands. Preferably, the transformer used in the inventive approach may have band-pass behavior. Such an embodiment of the inventive approach offers the further advantage that improved adjustability of the frequency response of the amplification of the amplifier circuit as opposed to conventional low-noise amplifiers may be realized.

The primary-side inductance of the transformer may be coupled between a supply voltage terminal of the amplifier circuit and the first or second terminal of the transistor in a preferred embodiment. As a further advantage of the inventive approach, it is thus to be mentioned that by such coupling of the primary side of the transformer, thus taking advantage of the inductance of the primary side of the transformer, for example a radio-frequency signal may be prevented from coupling over from the first or second terminal of the transistor to the supply voltage terminal. A coil for the voltage supply, as it is used in conventional amplifiers, is not necessary in the inventive approach.

Furthermore, the inventive approach offers the further advantage to employ the amplifier circuit at higher frequencies than this is possible for example in conventional single-stage amplifier circuits. In particular, this results from the fact that the amplification of the amplifier circuit of the inventive approach may be improved by the employment of the transformer particularly at high frequencies.

As a further advantage of the inventive approach, it is to be mentioned that by the use of a preferably lossy transformer the stability of the inventive amplifier circuit may be ensured. Particularly by the transformer offering ohmic resistance on the primary side as well as on the secondary side, the stability of the amplifier circuit of the inventive approach may be further optimized as opposed to a conventional amplifier circuit.

Preferably, the primary side of the transformer has high impedance, whereas the second side of the transformer has low impedance. From this, a further advantage results that a reverse isolation of the amplifier circuit may be improved as opposed to a conventional amplifier circuit. By the low impedance of the secondary side of the transformer, unwanted influences from the signal output into the amplifier circuit, such as reflections of signals at the signal output, are dampened. A conventional amplifier circuit offers significantly lower reverse isolation as opposed to this.

BRIEF DESCRIPTION OF THE DRAWINGS

These and other objects and features of the present invention will become clear from the following description taken in conjunction with the accompanying drawings, in which:

FIG. 5 is a table reproducing a comparison of simulated parameters of the embodiment of the inventive amplifier circuit illustrated in FIG. 1 as opposed to a conventional amplifier circuit.

DESCRIPTION OF THE PREFERRED EMBODIMENTS

Figure 1:
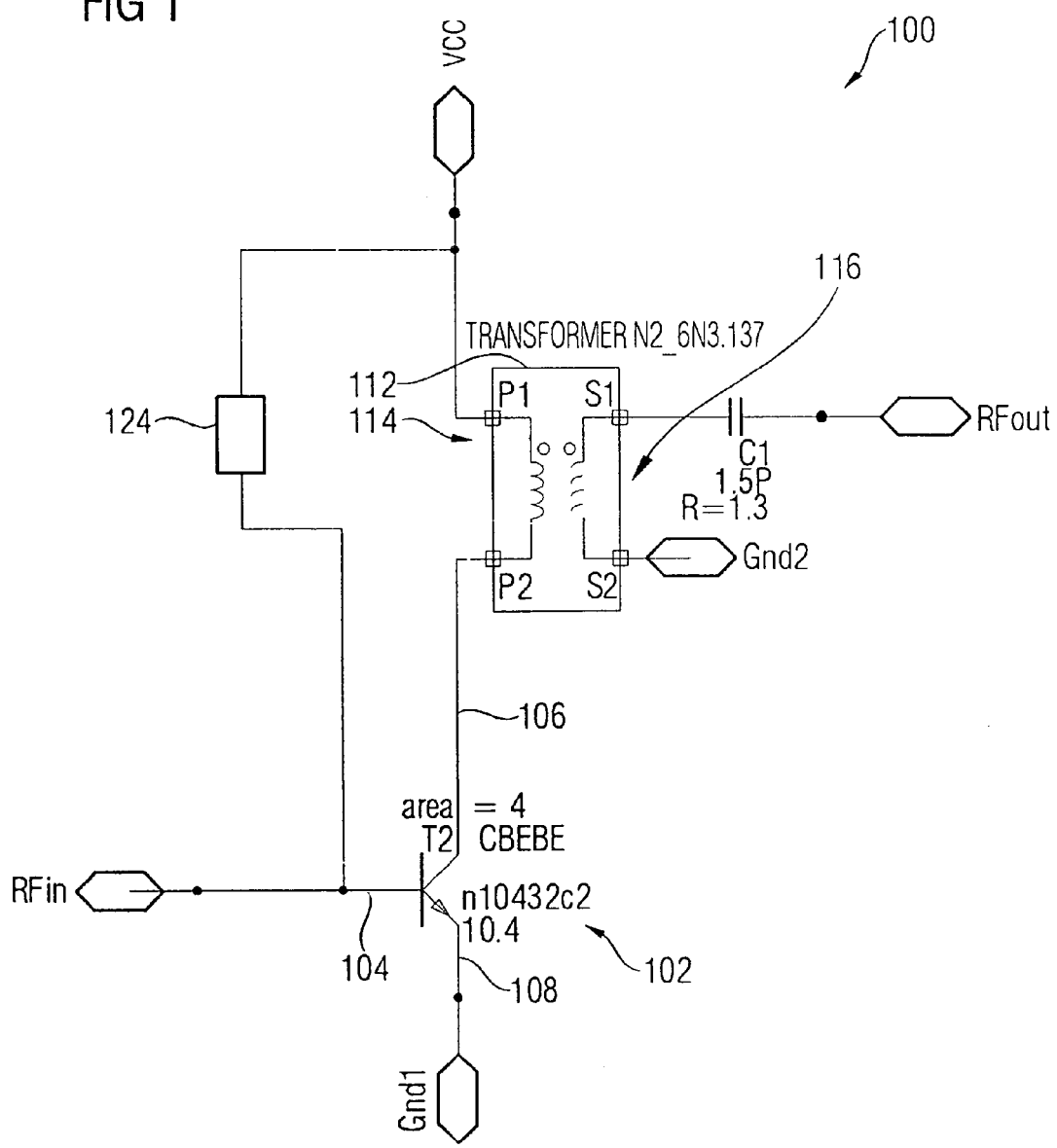
FIG. 1 is a circuit diagram of an embodiment of the inventive amplifier circuit.

FIG. 1 shows an embodiment of the inventive amplifier circuit 100. The amplifier circuit 100 includes a transistor 102. The transistor 102 may be an npn bipolar transistor, as illustrated in FIG. 1. Alternatively, however, also a pnp bipolar transistor or a MOS transistor may be used for the transistor 102.

The transistor 102 includes a control terminal 104 (base terminal). Furthermore, the transistor 102 includes a first terminal 106 (collector terminal) as well as a second terminal 108 (emitter terminal). Furthermore, the amplifier circuit 100 illustrated in FIG. 1 includes a radio-frequency input RFin to which a radio-frequency signal to be amplified may be applied. The radio-frequency input RFin is connected to the base terminal 104 or the transistor 102. The emitter terminal 108 of the transistor 102 is conductively connected to a ground terminal GND1.

Furthermore, the amplifier circuit 100 includes a transformer 112 with a primary side 114 and a secondary side 116. The primary side 114 includes a first primary-side terminal P1, a second primary-side terminal P2 and a primary inductance between the first primary-side terminal P1 and the second primary-side terminal P2. The secondary side 116 of the transformer 112 includes a first secondary-side terminal S1, a second secondary-side terminal S2, and a secondary inductance between the first secondary-side terminal S1 and the second secondary-side terminal S2. The second primary-side terminal P2 of the transformer 112 is connected to the collector terminal 106 of the transistor.

The first primary-side terminal P1 of the transformer 112 is conductively connected to a supply voltage terminal VCC.

The first secondary-side terminal S1 of the transformer 112 is further coupled to a radio-frequency output RFout via a capacity C1. The second secondary-side terminal S2 is further conductively connected to a further ground terminal GND2. Preferably, the ground potential of the ground terminal GND1 as well as the ground potential of the further ground terminal GND2 are for example separated from each other.

Furthermore, the first primary-side terminal P1 of the transformer 112 is connected to the base terminal 104 of the transistor 102 via a resistor 124.

In order to start up the amplifier circuit 100, for example a positive supply voltage +2.75 volts with reference to the ground potential of the ground terminal GND1 may be applied to the supply voltage terminal VCC. If now a radio-frequency signal is applied to the radio-frequency input RFin, the signal applied to the radio-frequency input RFin is amplified by the transistor 102 with an amplification factor given by the transistor 102. From this, a radio-frequency current between the first terminal 106 of the transistor 102 as well as the second terminal 108 of the transistor 102 results. By the choice of the transistor 102 as bipolar transistor and with the emitter basic circuit of the transistor 102 illustrated in FIG. 1, thus a radio-frequency collector-emitter current through the transistor 102 results depending on the radio frequency present at the radio-frequency input RFin. By the connection of the primary side 114 of the transformer 112 between the collector terminal 106 and the transistor 102 as well as the supply voltage terminal VCC, the amplified signal may thus be transmitted from the primary side 114 of the transformer 112 to the secondary side 116 of the transformer 112. By the capacity C1 connected between the first secondary-side terminal S1 and the radio-frequency output RFout, here decoupling is ensured, so that only a radio-frequency portion of the amplified signal is transmitted to the radio-frequency output RFout. Furthermore, by suitable choice of the capacity value of the capacity C1, optional matching of the transfer properties of the amplifier circuit may be achieved. If now the transformer 112 is preferably formed such that the primary side 114 has high impedance and the secondary side 116 low impedance, thus higher amplification of the amplifier circuit 100 may be achieved than could be realized only with a conventional coupling of the radio-frequency output RFout to the collector terminal 106 of the transistor 102. The transformer 112 thus acts as impedance transformer and increases the output impedance as seen from the transistor 102 acting as amplifier, such as from 10 ohms to 50 ohms or from 50 ohms to a value greater than 50 ohms. The collector terminal 106 of the transistor 102 connected as an npn bipolar transistor in emitter-basic circuit, as illustrated in FIG. 1, thus almost acts as ideal current source and may thus give off more radio-frequency power to the radio-frequency output RFout via the transformer 112 than this is possible in a conventional amplifier circuit.

In order to enable exact adjustment of a working point of the transistor 102, a predefined potential may be applied to the base terminal 104 of the transistor 102 by the resistor 124. To this end, the resistor 124 is connected between the supply voltage terminal VCC and the base terminal 104 of the transistor 102.

Furthermore, the amplifier circuit 100 has a lower radio-frequency collector current than a conventional low-noise amplifier due to the high impedance of the primary side 114 of the transformer 112. Since the non-linear behavior of a bipolar transistor in the practical applications is induced by a distortion of the radio-frequency collector current, thus a higher compression point P1dB and higher third-order intermodulation IP3 than in conventional single-stage amplifiers may be realized by the inventive approach.

Figure 2:
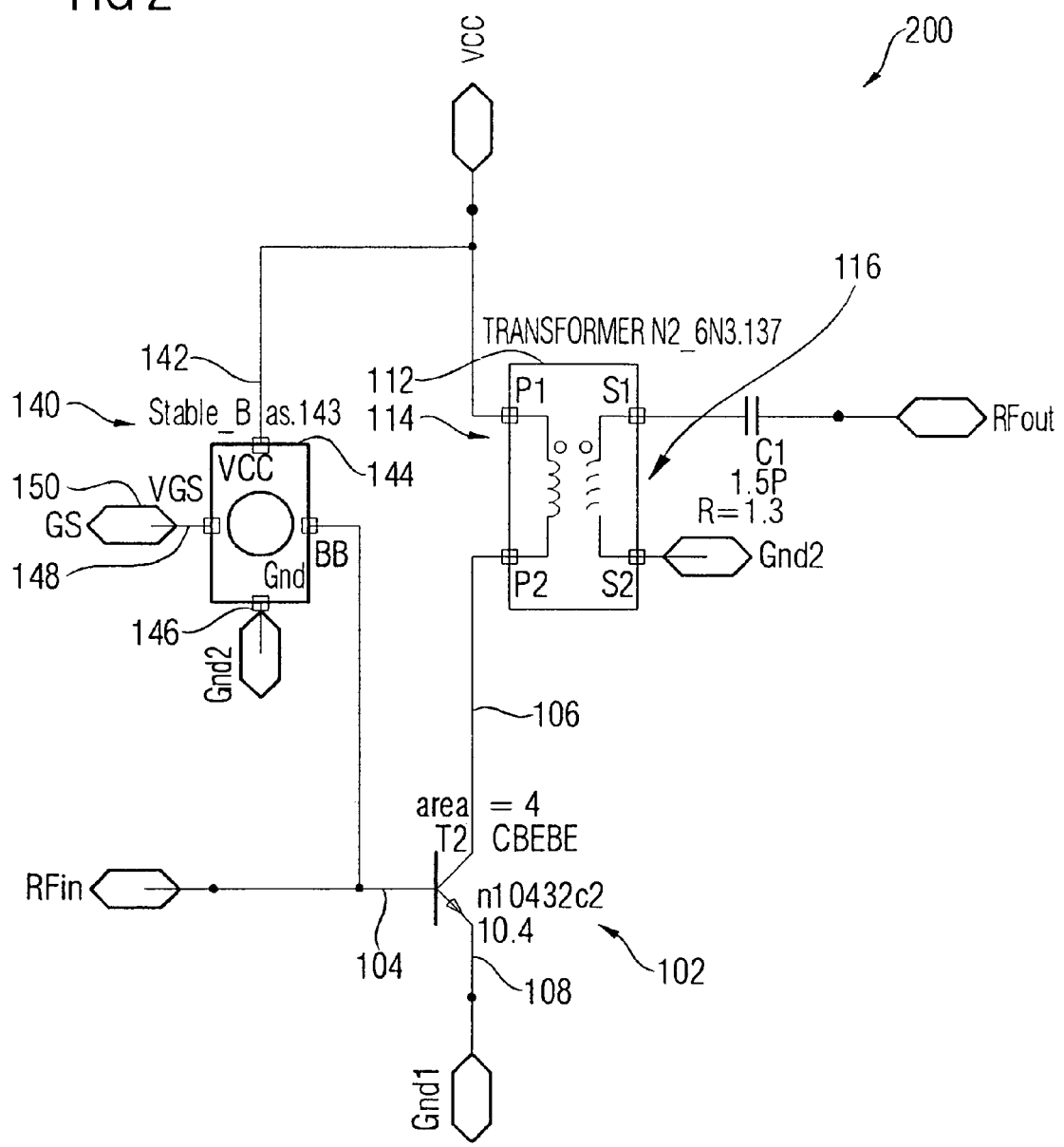
FIG. 2 is a circuit diagram of a further embodiment of the inventive amplifier circuit.

FIG. 2 shows a further embodiment of the inventive amplifier circuit. In contrast to the embodiment shown in FIG. 1, the amplifier circuit 200 illustrated in FIG. 2 includes a control circuit 140 with a first control circuit terminal 142, a second control circuit terminal 144, a third control circuit terminal 146, and a fourth control circuit terminal 148. The first control circuit terminal 142 is conductively connected to the first primary-side terminal P1 of the transformer 112. The second control circuit terminal 144 is conductively connected to the base terminal 104 of the transistor 102. The third control circuit terminal 146 is conductively connected to the second secondary-side terminal S2 of the transformer 112 via the further ground potential. The fourth control circuit terminal 148 is conductively connected to a further supply voltage terminal VGS.

As opposed to the amplifier circuit 100 illustrated in FIG. 1, the amplifier circuit 200 illustrated in FIG. 2 offers the advantage of an active DC current supply for the transistor 102. This includes the control circuit 140 with the aid of which a voltage independent of the voltage present at the supply voltage terminal VCC may be applied to the base terminal of the working point of the transistor 102.

Figure 3:
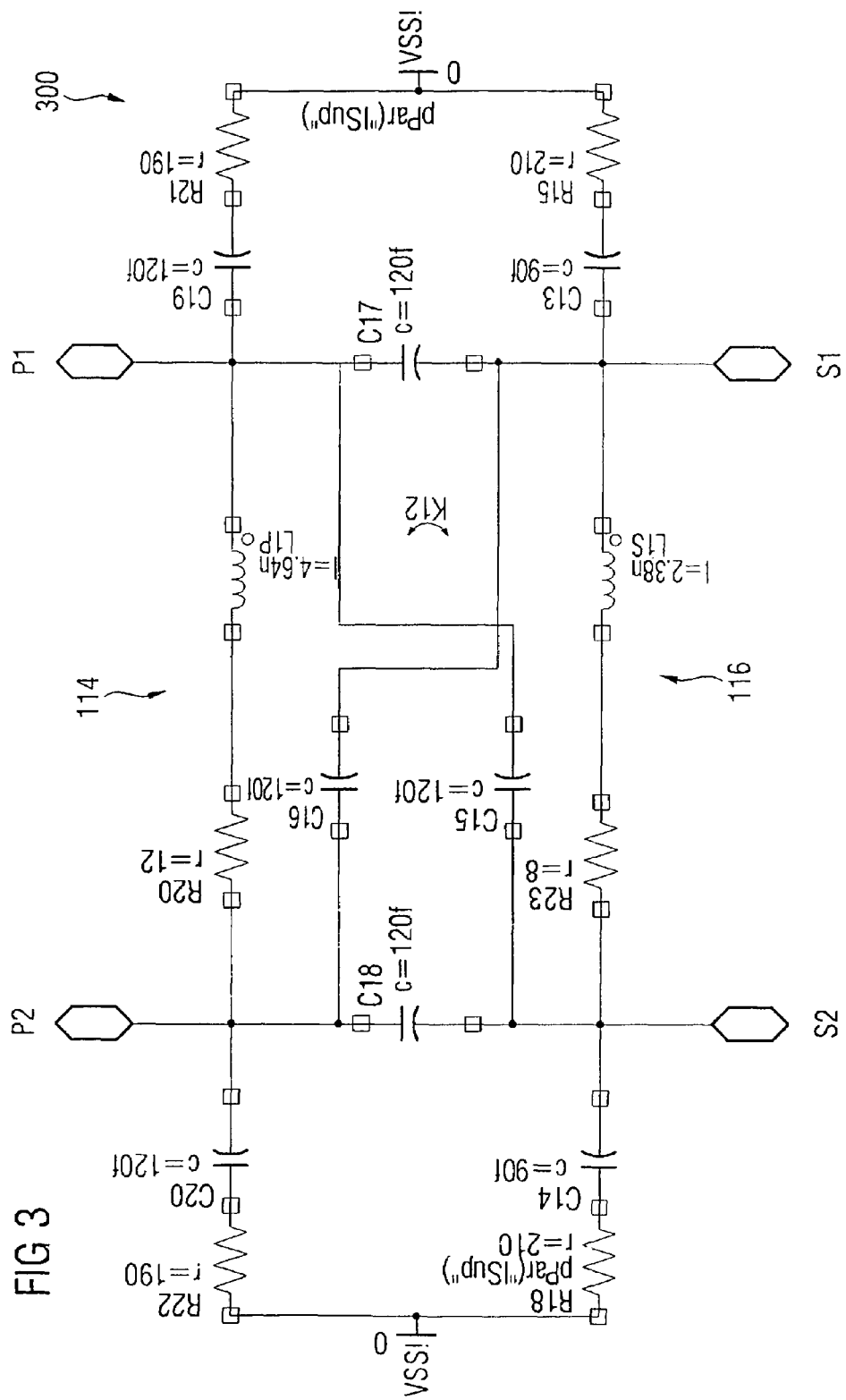
FIG. 3 is a possible equivalent circuit diagram of the transformer used in FIG. 2.

FIG. 3 shows an equivalent circuit diagram 300 of the transformer 112 used in FIG. 1 and FIG. 2. By the equivalent circuit diagram 300, two coils coupled to the coupling factor K12 are characterized, which are for example realized in integrated technology. More specifically, the coils are implanted as metallizations on the passivation layer of a substrate provided with a ground metallization on its bottom side. The primary-side coil is represented by a primary-side inductance L1P and by a primary-side ohmic resistance R20 and is connected between the first primary-side terminal P1 and the second primary-side terminal P2. The secondary-side coil is represented by a secondary-side inductance L1S and a secondary-side ohmic resistance R23. The elements between the terminals P2 and S2 and a ground level potential VSS (usually 0 V) and between the terminals P1 and S1 and the ground level potential VSS result from parasitic effects to be taken into account between the coil conductors on the passivation layer of the substrate and the ground metallization on the bottom side of the substrate.

From the simulated device values used of the equivalent circuit diagram 300, it may be seen that a primary-side impedance between the first primary-side terminal P1 and the second primary-side terminal P2 is higher than a secondary-side impedance between the first secondary-side terminal S1 and the second secondary-side terminal S2. This may be recognized in particular from the value of the primary-side ohmic resistance R20 of the primary-side impedance as opposed to the secondary-side ohmic resistance R23 of the secondary-side impedance, wherein the primary-side ohmic resistance R20 is greater than the secondary-side ohmic resistance R23. Furthermore, by the primary-side inductance L1P as opposed to the secondary-side inductance L1S, the higher impedance value of the primary side 114 as opposed to the impedance value of the secondary side 116 may be recognized.

From FIG. 3 it also becomes apparent that the primary-side inductance L1P is connected directly between the first primary-side terminal P1 and the second primary-side terminal P2. The use of a transformer 112 such formed thus enables the above-mentioned direct connection of the supply voltage to the primary side 114 of the transformer 112. A separation of a radio-frequency signal from the supply voltage terminal VCC illustrated in FIG. 1 hereby does not require an external coil between the supply voltage terminal VCC and the collector terminal of the transistor. Hereby, a cost reduction for a radio-frequency amplifier circuit may be realized as opposed to a conventional low-noise amplifier.

In conventional amplifiers, often an additional ohmic resistance is connected in series between the supply voltage terminal and the collector, in order to increase the stability of the amplifier, i.e. the transistor in the emitter basic circuit. By the use of a transformer 112 constructed according to FIG. 3 with the primary-side ohmic resistance R20, already an ohmic resistance in series connection between the supply voltage terminal VCC illustrated in FIG. 1 or FIG. 2 and the collector terminal 106 of the transistor 102 is realized, whereby the stability of the amplifier circuit illustrated in FIG. 1 or FIG. 2 may be ensured. In addition, however, the secondary-side ohmic resistance R23 is to be taken into account, which has a further stabilizing effect on the amplifier circuit by the coupling behavior with the coupling factor K12 of the transformer 112.

As it has already been mentioned, the first impedance (i.e. the impedance of the primary side 114) is greater than the second impedance (i.e. the impedance of the secondary side 116). Hereby an amplifier circuit may be realized, which has smaller impedance between the radio-frequency output RFout illustrated in FIG. 1 or FIG. 2 and the further ground terminal GND2 (output signal impedance) than a conventional amplifier circuit. By such a smaller output signal impedance of the amplifier circuit as well as the ohmic loss of the transformer (i.e. the ohmic loss by the secondary-side ohmic resistance R23 as well as the primary-side ohmic resistance R20 to be taken into account with the coupling factor K12), a reverse influence of a signal from the radio-frequency output RFout on the radio-frequency input RFin may be reduced as opposed to conventional amplifier circuits. For this reason, it can be said that the reverse isolation of the inventive amplifier circuit is enhanced as opposed to a conventional amplifier circuit.

Figure 4:
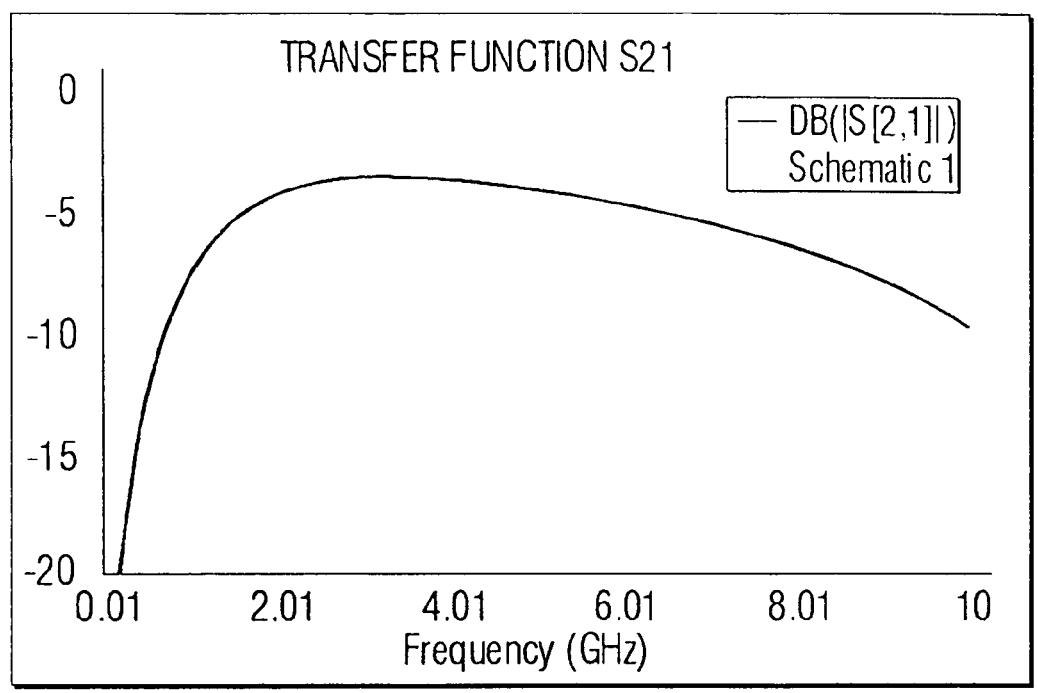
FIG. 4 is a diagram reproducing a transfer function of the transformer illustrated in FIG. 3.

FIG. 4 shows a diagram of a simulation result of a transfer function of the transformer using the equivalent circuit diagram according to FIG. 3. From the illustration of the simulation result in FIG. 4, it becomes apparent that the transformer has a band-pass transfer function. In a connection according to FIG. 1 or FIG. 2, it acts like a short in low frequencies via the second secondary-side terminal S2 set to the further ground potential GND 2, while its loss increases at high frequencies owing to parasitic effects (higher resistance owing to the skin effect, parasitic capacities against ground etc.). As opposed to that, a conventional simple amplifier from a npn bipolar transistor only has high amplification at low frequencies, but at the same time has a strong decrease at high frequencies. If a narrow-band low-noise amplifier is desired, the frequency response of the amplification is often not solved satisfactorily in conventional amplifiers in order to suppress crosstalk between individual frequency bands. By the choice of the transformer, the amplification at frequencies interesting for an application may therefore be set to a maximum and be dampened more strongly in other frequencies than with conventional solutions. In particular, by a suitable choice of primary- and secondary-side ohmic resistances as well as inductances, the transfer behavior of the transformer may be influenced.

Since the amplification of the inventive amplifier circuit may be enhanced at higher frequencies by the choice or design of the transformer, also an increase of the frequencies at which the amplifier circuit is to be employed may be realized as opposed to for example a single-stage low-noise amplifier from a npn bipolar transistor.

Furthermore, the transformer is easy to realize in terms of manufacturing by integrating the transformer 112 in the substrate at the same time in the manufacture of the transistor 102 illustrated in FIG. 1 or FIG. 2 in a substrate, for example. Hereby, apart from the transistor 102, at the same time the, preferably lossy, transformer may be formed as an integrated circuit with the transistor 102, whereby the inventive amplifier circuit may be manufactured inexpensively.

FIG. 5 shows a tabular comparison of simulated parameter values of an amplifier circuit according to FIG. 2 using a transformer according to FIG. 3, as opposed to a conventional low-noise amplifier with an on-chip coil. In the table, those parameter values of the simulated amplifier circuit according to claim 2 are characterized with the words "higher" and "better", which represent an enhanced characteristic of the amplifier circuit as opposed to a conventional low-noise amplifier.

The table from FIG. 5 thus shows the comparison between the embodiment of the inventive amplifier circuit illustrated in FIG. 2 and a conventional low-noise amplifier with same configuration without the transformer, but with an on-chip coil for the front end of UMTS receivers in the frequency range of 2.11 GHz to 2.17 GHz. It is clearly obvious from the table in FIG. 5 that the simulation of the embodiment of the inventive amplifier circuit yields clearly better results than a simulation of the conventional low-noise amplifier both in the amplification and the linearity.

In summary, it can be noted that by the employment of a preferably lossy transformer at the output of a low-noise amplifier in emitter basic circuit from a npn bipolar transistor, higher amplification at higher frequencies, a narrower frequency response of the amplification and at the same time a higher compression point, higher third-order intermodulation, and higher stability may be achieved.

Such an improvement was shown at the example of an amplifier circuit for the front end of UMTS receivers in the frequency range of 2.11 GHz to 2.17 GHz. A conventional low-noise amplifier is able to achieve an amplification of about 14 dB, whereas about 16 dB may be achieved by the solution proposed here, wherein other parameters, such as the 1 dB compression point and the third-order intermodulation may also be improved by one dB.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

REFERENCE NUMERAL LIST

100 amplifier circuit
102 transistor
104 base terminal
106 collector terminal
108 emitter terminal
GND1 ground potential terminal
RFin radio-frequency input
112 transformer
114 primary side of the transformer 112
116 secondary side of the transformer 112
P1 first primary-side terminal of the transformer 112
P2 second primary-side terminal of the transformer 112
S1 first secondary-side terminal of the transformer 112
S2 second secondary-side terminal of the transformer 112
VCC supply voltage terminal
124 resistor
C1 capacity
RFout radio-frequency output
GND2 further ground potential terminal
140 control circuit
142 first control circuit terminal
144 second control circuit terminal
146 third control circuit terminal
148 fourth control circuit terminal
150 terminal of a further supply voltage VGS
R20 primary-side ohmic resistance
L1P primary-side inductance
R23 secondary-side ohmic resistance
L1S secondary-side inductance

What is claimed is:

1. An amplifier circuit, comprising:
    a transistor including a control terminal, a first terminal and a second terminal;
    a signal input terminal coupled to the control terminal of the transistor;
    a transformer including a primary side and a secondary side, the primary side of the transformer coupled to the first terminal of the transistor; and
    a signal output terminal coupled to the secondary side of the transformer,
    wherein the transformer comprises a first primary-side terminal and a second primary-side terminal and comprises a first secondary-side terminal and a second secondary-side terminal, wherein a first impedance between the first primary-side terminal and the second primary-side terminal is greater than a second impedance between the first secondary-side terminal and the second secondary-side terminal.

2. The amplifier circuit of claim 1, further comprising a supply voltage terminal, wherein the first terminal of the transistor is coupled to the primary side of the transformer and the primary side of the transformer is also coupled to the supply voltage terminal.

3. The amplifier circuit of claim 1, wherein the first impedance includes an inductance with an ohmic resistance.

4. The amplifier circuit of claim 1, wherein the second impedance includes an inductance with an ohmic resistance.

5. The amplifier circuit of claim 1, wherein the transistor is a bipolar transistor comprising a base terminal, the base terminal being the control terminal of the transistor.

6. The amplifier circuit of claim 5, wherein the bipolar transistor comprises an emitter terminal coupled to a reference potential terminal and a collector terminal coupled to the primary side of the transformer, wherein the collector terminal is the first terminal and the emitter terminal is the second terminal.

7. The amplifier circuit of claim 5, wherein the bipolar transistor is a npn bipolar transistor.

8. The amplifier circuit of claim 1, further comprising: a control circuit including a control circuit control terminal, the control circuit control terminal being coupled to the control terminal of the transistor.

9. The amplifier circuit of claim 8, wherein the control circuit further includes a control circuit first terminal coupled to the primary side of the transformer.

10. The amplifier circuit of claim 1, further including: a substrate in which the transistor and the transformer are formed.

11. The amplifier circuit of claim 1, wherein the first terminal of the transistor is a collector terminal.

12. The amplifier circuit of claim 2 wherein the first terminal of the transistor is coupled to the second primary-side terminal of the transformer.

13. The amplifier circuit of claim 2 wherein the first primary-side terminal of the transformer is coupled to the supply voltage terminal.

14. The amplifier circuit of claim 1,
wherein the first secondary-side terminal is coupled to the signal output terminal and the second secondary-side terminal is coupled to a reference potential terminal.

15. The amplifier circuit of claim 14, wherein the reference potential terminal has a ground potential.

16. An amplifier circuit, comprising:
a transistor including a control terminal, a first terminal and a second terminal;
a signal input terminal coupled to the control terminal of the transistor;
a transformer including a primary side and a secondary side, the primary side of the transformer coupled to the first terminal of the transistor; and
a signal output terminal coupled to the secondary side of the transformer,
wherein the second terminal of the transistor is coupled to a reference potential terminal having a ground potential, and wherein the secondary side of the transformer is coupled to a further reference potential terminal having a further ground potential separate from the ground potential of the reference potential terminal.

17. An amplifier circuit, comprising:
a transistor including a plurality of terminals;
a signal input terminal coupled to one of the plurality of terminals of the transistor;
a transformer including a primary side and a secondary side, the primary side of the transformer coupled to one of the plurality of terminals of the transistor; and
a signal output terminal coupled to the secondary side of the transformer,
wherein the transformer comprises a first primary-side terminal and a second primary-side terminal and comprises a first secondary-side terminal and a second secondary-side terminal, wherein a first impedance between the first primary-side terminal and the second primary-side terminal is greater than a second impedance between the first secondary-side terminal and the second secondary-side terminal.

18. The amplifier circuit of claim 17, wherein the plurality of terminals of the transistor include a control terminal, a first terminal and a second terminal, and wherein the control terminal is connected to the signal input terminal, the first terminal is connected to the primary side of the transformer, and the second terminal is connected to a reference potential.

19. The amplifier circuit of claim 18 wherein the transistor is a bipolar transistor, the first terminal is a collector terminal, and the second terminal is an emitter terminal, and the control terminal is a base terminal.

20. A method of amplifying a signal between a signal input terminal and a signal output terminal, the method comprising:
providing a transistor comprising a plurality of terminals, wherein one of the plurality of terminals is connected to the signal input terminal;
providing a transformer having a primary side and a secondary side, wherein the primary side of the transformer is connected to another of the plurality of terminals of the transistor and the secondary side of the transformer is connected to the signal output terminal, and wherein the primary side of the transformer has a higher impedence than the secondary side of the transformer;
receiving a signal at a signal input terminal; and outputting an amplified signal at the signal output terminal.

* * * * *